US010382086B2

(12) United States Patent
Uejima (10) Patent No.: US 10,382,086 B2
(45) Date of Patent: Aug. 13, 2019

(54) HIGH-FREQUENCY SWITCH MODULE (71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/669,140

(22) Filed: Aug. 4, 2017

(65) Prior Publication Data
US 2018/0026671 A1 Jan. 25, 2018

Related U.S. Application Data (63) Continuation of application No. PCT/JP2016/052865, filed on Feb. 1, 2016.

(30) Foreign Application Priority Data

Feb. 5, 2015 (JP) ................. 2015-020843

(51) Int. Cl.
*H04B 1/44* (2006.01)
*H04B 1/48* (2006.01)
*H04B 1/00* (2006.01)
*H04B 1/50* (2006.01)
(Continued)

(52) U.S. Cl.
CPC ............. *H04B 1/48* (2013.01); *H03H 7/0115* (2013.01); *H03H 7/465* (2013.01); *H04B 1/00* (2013.01);
(Continued)

(58) Field of Classification Search
CPC .... H04B 1/006; H04B 1/0057; H04B 1/0458; H04B 1/48; H04B 1/005; H04B 1/18;
(Continued)

(56) References Cited

U.S. PATENT DOCUMENTS

2004/0090215 A1* 5/2004 Ishii ................... H02M 3/1582
323/225
2007/0222697 A1* 9/2007 Caimi ................... H01Q 1/243
343/861
(Continued)

FOREIGN PATENT DOCUMENTS

JP 2005-260806 A 9/2005
JP 2006-109084 A 4/2006
(Continued)

OTHER PUBLICATIONS

International Search Report issued in Application No. PCT/JP2016/052865 dated Apr. 19, 2016.
(Continued)

*Primary Examiner* — Ajibola A Akinyemi
(74) *Attorney, Agent, or Firm* — Pearne & Gordon LLP (57) ABSTRACT

A high-frequency switch module (10) includes a switch element (20) and an inductor (30). The switch element (20) includes a Hi band common terminal (P10), a Low band common terminal (P20), a plurality of selection target terminals (P11 to P14) that are selectively connected to the common terminal (P10), and a plurality of selection target terminals (P21 to P24) that are selectively connected to the common terminal (P20). The inductor (30) is connected between a first selection target terminal (P14) of the selection target terminals (P11 to P14) and a selection target terminal (P21) of the selection target terminals (P21 to P24). The selection target terminal (P14) and the selection target terminal (P21) are simultaneously used terminals that are used for electric paths through which transmission or reception using a plurality of communication bands is performed at the same time.

20 Claims, 5 Drawing Sheets (51) Int. Cl.
 *H03H 7/01* (2006.01)
 *H03H 7/46* (2006.01)
 *H04B 1/04* (2006.01)
 *H04B 1/18* (2006.01)
 *H03H 1/00* (2006.01)

(52) U.S. Cl.
 CPC ........... *H04B 1/006* (2013.01); *H04B 1/0064* (2013.01); *H04B 1/0458* (2013.01); *H04B 1/18* (2013.01); *H04B 1/50* (2013.01); *H03H 2001/0085* (2013.01); *H03H 2007/013* (2013.01); *H04B 2001/485* (2013.01)

(58) Field of Classification Search
 CPC ........ H04B 1/0064; H04B 1/44; H04B 1/525; H04B 2001/485; H04B 1/10; H04B 1/38; H04B 1/40; H04B 1/406; H04B 2001/0416; H04B 7/0602; H04B 15/00
 USPC .......................................................... 455/78
 See application file for complete search history.

(56) References Cited

U.S. PATENT DOCUMENTS

2013/0154761 A1* 6/2013 Ilkov ..................... H03H 7/465
 333/101
2014/0044022 A1 2/2014 Matsuo et al.
2015/0133067 A1* 5/2015 Chang ..................... H04B 1/48
 455/78

FOREIGN PATENT DOCUMENTS

JP 2014-36409 A 2/2014
WO 2014/119046 A1 8/2014

OTHER PUBLICATIONS

Written Opinion issued in Application No. PCT/JP2016/052865 dated Apr. 19, 2016.

* cited by examiner

FIG. 10

HIGH-FREQUENCY SWITCH MODULE

This is a continuation of International Application No. PCT/JP2016/052865 filed on Feb. 1, 2016 which claims priority from Japanese Patent Application No. 2015-020843 filed on Feb. 5, 2015. The contents of these applications are incorporated herein by reference in their entireties.

BACKGROUND OF THE DISCLOSURE

Field of the Disclosure

The present disclosure relates to a high-frequency switch module which is used for a front-end part or the like of a wireless communication apparatus.

Description of the Related Art

Nowadays, in accordance with diversification of communication bands, wireless communication apparatuses such as cellular phones include a front-end circuit capable of communication using many communication bands. Miniaturization of such front-end circuits has been achieved by implementing transmission and reception of transmission signals and reception signals of a plurality of communication bands using an antenna which is shared between these communication bands. To share an antenna between a plurality of communication bands, switch modules have been widely adopted, as described in Patent Document 1.

For example, the switch module described in Patent Document 1 includes transmission and reception circuits for a plurality of communication bands and an SPnT (n represents an integer of 2 or more) switch element. A common terminal of the switch element is connected to an antenna, and a plurality of selection target terminals are connected to the transmission and reception circuits of the individual communication bands. With this configuration, any of the transmission and reception circuits of the plurality of communication bands is connected to the antenna in a selective manner.

Furthermore, nowadays, carrier aggregation for transmission or reception using a plurality of communication bands at the same time has been put into practical use. Switch modules supporting carrier aggregation use a switch including a Hi band antenna connection terminal and a Low band antenna connection terminal. The switch connects, by switching, the Hi band antenna connection terminal to a plurality of Hi band selection target terminals, and connects, by switching, the Low band antenna connection terminal to a plurality of Low band selection target terminals.

Patent Document 1: Japanese Unexamined Patent Application Publication No. 2006-109084

BRIEF SUMMARY OF THE DISCLOSURE

In the case where carrier aggregation is implemented using two antennas, transmission using a Low band and reception using a Hi band at the same time may cause the problem described below. In the case where a harmonic frequency of a transmission signal of a Low band and a fundamental frequency of a reception signal of a Hi band are close to each other or overlap, a harmonic component of the transmission signal of the Low band may come to a transmission path for the reception signal of the Hi band. This is because capacitive coupling of a selection target terminal from which the reception signal of the Hi band is output and a selection target terminal to which the transmission signal of the Low band is input occurs in a switch. Consequently, the reception sensitivity of the reception signal of the Hi band degrades.

If a Low band switch and a Hi band switch are separated and isolated from each other, the degree of the capacitive coupling is reduced. However, miniaturization of a high-frequency switch module is hindered.

An object of the present disclosure is to provide a small-size high-frequency switch module whose transmission and reception characteristics of individual communication bands are not degraded even if carrier aggregation is implemented.

A high-frequency switch module according to the present disclosure includes a switch element and an inductor. The switch element includes a first common terminal connected to a Hi band antenna, a second common terminal connected to a Low band antenna, a plurality of first selection target terminals selectively connected to the first common terminal, and a plurality of second selection target terminals selectively connected to the second common terminal. The inductor is connected between one of the plurality of first selection target terminals and one of the plurality of second selection target terminals. In particular, the first selection target terminal and the second selection target terminal that are connected to the inductor are simultaneously used terminals that are used for electric paths through which simultaneous transmission or simultaneous reception using a plurality of communication bands is performed.

With this configuration, a capacitor generated by capacitive coupling between the first selection target terminal as the simultaneously used terminal of the plurality of first selection target terminals and the second selection target terminal as the simultaneously used terminal of the plurality of second selection target terminals, and the inductor form a parallel resonance circuit. With the parallel resonance circuit, even if the first connection conductor that is connected to the first selection target terminal as the simultaneously used terminal and the second connection conductor that is connected to the second selection target terminal as the simultaneously used terminal are close to each other, a high isolation between the first connection conductor and the second connection conductor may be ensured.

Furthermore, it is preferable that the high-frequency switch module according to the present disclosure has a configuration described below. The high-frequency switch module includes a circuit substrate at which the switch element and the inductor are mounted. A first connection conductor which allows connection between the first selection target terminal as the simultaneously used terminal and the inductor and a second connection conductor which allows connection between the second selection target terminal as the simultaneously used terminal and the inductor are formed at the circuit substrate. The first connection conductor and the second connection conductor are arranged at positions different in a thickness direction of the circuit substrate. The circuit substrate includes an inner-layer ground conductor between the first connection conductor and the second connection conductor.

With this configuration, the capacitive coupling between the first and second connection conductors may be suppressed. Accordingly, addition of an unnecessary capacitor to the parallel resonance circuit may be suppressed. Therefore, the inductance may be increased, and the isolation may be improved.

Furthermore, in the high-frequency switch module according to the present disclosure, the switch element includes a third selection target terminal between the first selection target terminal as the simultaneously used terminal and the second selection target terminal as the simultaneously used terminal, the third selection target terminal using a communication band different from the plurality of communication bands used by the simultaneously used terminals.

With this configuration, the capacitive coupling between the first and second selection target terminals as the simultaneously used terminals may be suppressed. Accordingly, the isolation may be improved.

Furthermore, the high-frequency switch module according to the present disclosure may include a capacitor that is connected in parallel with the inductor.

With this configuration, a larger capacitor of the parallel resonance circuit may be achieved, and a smaller inductor may thus be achieved. Accordingly, the size of the high-frequency switch module may further be reduced.

Furthermore, the high-frequency switch module according to the present disclosure may have a configuration described below. The high-frequency switch module includes a first RF terminal that is connected to the first selection target terminal as the simultaneously used terminal, and a first connection conductor that allows connection between the first RF terminal and the first selection target terminal as the simultaneously used terminal. In the high-frequency switch module, a matching inductor is connected between the first selection target terminal as the simultaneously used terminal and the inductor at the first connection conductor.

With this configuration, matching of the impedance between the circuit element (for example, an elastic wave filter) connected to the first RF terminal and the first selection target terminal may be achieved more accurately.

Furthermore, the high-frequency switch module according to the present disclosure may have a configuration described below. The high-frequency switch module includes a second RF terminal that is connected to the second selection target terminal as the simultaneously used terminal, and a second connection conductor that allows connection between the second RF terminal and the second selection target terminal as the simultaneously used terminal. In the high-frequency switch module, a matching inductor is connected between the inductor and the second RF terminal at the second connection conductor.

With this configuration, matching of the impedance between the circuit element (for example, an elastic wave filter) connected to the second RF terminal and the second selection target terminal may be achieved more accurately.

Furthermore, the high-frequency switch module according to the present disclosure may have a configuration described below. The inductor is a conductive pattern in a spiral shape formed at a circuit substrate. A ground conductor that is formed inside the circuit substrate and is close to the inductor has a shape that does not overlap with a cavity at the center of the spiral shape.

With this configuration, the degradation in the Q of the inductor may be suppressed. Accordingly, the isolation between the first selection target terminal and the second selection target terminal may further be improved.

According to the present disclosure, a small-size high-frequency switch module whose transmission and reception characteristics using individual communication bands are not degraded even if communication based on carrier aggregation such as simultaneous transmission or simultaneous reception using a plurality of communication bands is performed, may be achieved.

DETAILED DESCRIPTION OF THE DISCLOSURE

Figure 1:
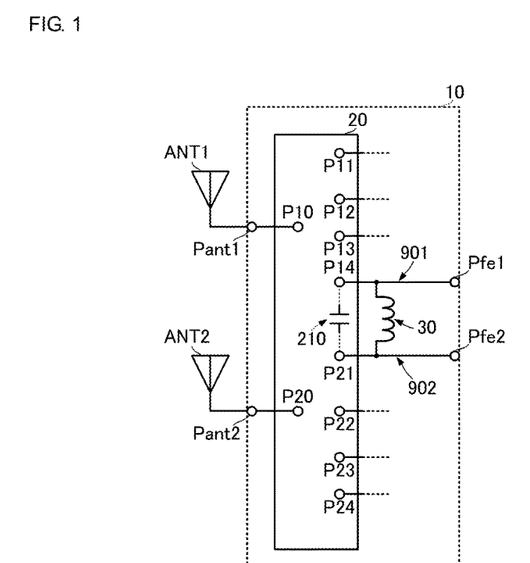
FIG. 1 is a circuit diagram of a high-frequency switch module according to a first embodiment of the present disclosure.

A high-frequency switch module according to a first embodiment of the present disclosure will be described with reference to the drawings. FIG. 1 is a circuit diagram of the high-frequency switch module according to the first embodiment of the present disclosure.

A high-frequency switch module 10 according to this embodiment includes a switch element 20 and an inductor 30. The high-frequency switch module 10 includes a first antenna connection terminal Pant1, a second antenna connection terminal Pant2, and a plurality of RF terminals. The plurality of RF terminals include a first RF terminal Pfe1 and a second RF terminal Pfe2.

The switch element 20 includes a first common terminal P10, a second common terminal P20, and selection target terminals P11, P12, P13, P14, P21, P22, P23, and P24. The switch element 20 is a DPnT switch formed by a semiconductor switch. Here, n may be an integer of 4 or more. The first common terminal P10 is selectively connected to any of the selection target terminals P11, P12, P13, and P14. The second common terminal P20 is selectively connected to any of the selection target terminals P21, P22, P23, and P24.

The first common terminal P10 is connected to the first antenna connection terminal Pant1. The first antenna connection terminal Pant1 is connected to a Hi band antenna ANT1. The second common terminal P20 is connected to the second antenna connection terminal Pant2. The second antenna connection terminal Pant2 is connected to a Low band antenna ANT2.

The selection target terminal P14 is connected to the first RF terminal Pfe1. The first RF terminal Pfe1 is connected to a filter element, for example, an elastic wave filter such as a SAW filter or an LC filter.

The selection target terminal P21 is connected to the second RF terminal Pfe2. The second RF terminal Pfe2 is connected to a filter element, for example, an elastic wave filter such as a SAW filter or an LC filter.

The inductor 30 is connected between the selection target terminal P14 and the selection target terminal P21. More specifically, the inductor 30 is connected between a connection conductor 901 which allows connection between the selection target terminal P14 and the first RF terminal Pfe1 and a connection conductor 902 which allows connection between the selection target terminal P21 and the second RF terminal Pfe2.

The high-frequency switch module 10 having the above circuit configuration is used as described below.

In the case where a communication signal of a Hi band is transmitted and received, the plurality of selection target terminals P11, P12, P13, and P14 are connected to the first common terminal P10 in a switching manner in accordance with communication bands for transmission and reception.

In the case where a communication signal of a Low band is transmitted and received, the plurality of selection target terminals P21, P22, P23, and P24 are connected to the second common terminal P20 in a switching manner in accordance with communication bands for transmission and reception.

Switching among the selection target terminals P11, P12, P13, and P14 with respect to the first common terminal P10 and switching among the selection target terminals P21, P22, P23, and P24 with respect to the second common terminal P20 may be performed independently or at the same time. Therefore, the high-frequency switch module 10 is capable of transmission and reception of a communication signal of a Hi band and a communication signal of a Low band at the same time. That is, the high-frequency switch module 10 is capable of communication based on carrier aggregation. Here, the concept of transmission and reception at the same time in this embodiment includes a case where transmission using both the Hi band and the Low band, reception using both the Hi band and the Low band, and transmission using one of the Hi band and the Low band and reception using the other one of the Hi band and the Low band.

With this configuration, a capacitor 210, which is generated between the selection target terminal P14 and the selection target terminal P21 in the switch element 20, and the inductor 30 form a parallel resonance circuit. The resonant frequency of the parallel resonance circuit is set to a harmonic component of a transmission signal of a Low band used for carrier aggregation and a frequency which is close to or overlaps with a fundamental frequency of a reception signal of a Hi band. For example, in the case where transmission using BAND 17 and reception using BAND 4 are performed at the same time, the resonant frequency is set to a frequency at which the frequency of three-fold harmonic of BAND 17 and the frequency of a fundamental wave of BAND 4 overlap.

With this configuration, by the parallel resonance circuit formed by the inductor 30 and the capacitor 210, a situation in which a harmonic component of the transmission signal of the Low band input from the second RF terminal is output from the first RF terminal may be suppressed. In other words, a high isolation between the connection conductor 901 and the connection conductor 902 may be ensured.

Accordingly, even if a reception signal of a Hi band is received while a transmission signal of a Low band being transmitted (carrier aggregation between the Low band and the Hi band) and the fundamental frequency of the reception signal and the frequency of a harmonic component of the transmission signal are close to each other or overlap, the degradation in the reception sensitivity of the reception signal may be suppressed.

Figure 2:
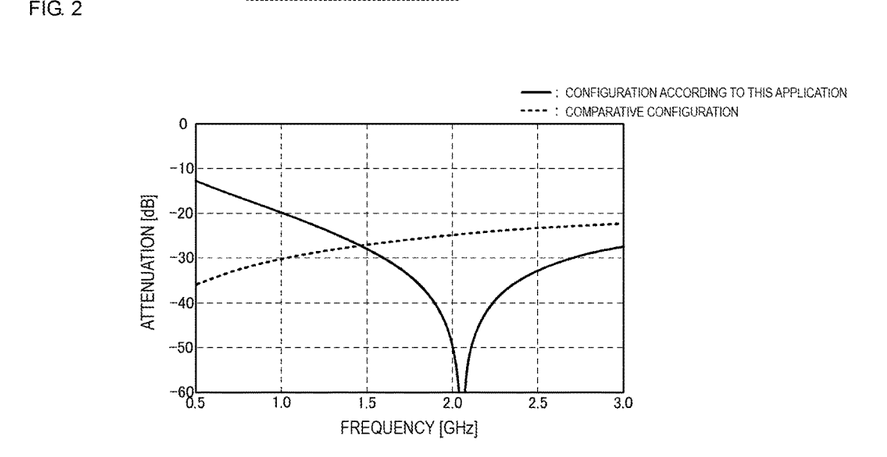
FIG. 2 is a graph illustrating the bandpass characteristics (attenuation characteristics) in the case where a parallel resonance circuit to be used for the high-frequency switch module according to the first embodiment of the present disclosure is inserted.

FIG. 2 is a graph illustrating the bandpass characteristics (attenuation characteristics) in the case where a parallel resonance circuit used for the high-frequency switch module according to the first embodiment of the present disclosure is inserted. In FIG. 2, a solid line represents the bandpass characteristics of the configuration of this application, and a broken line represents the bandpass characteristics of a comparative configuration (configuration of connection without a parallel resonance circuit inserted). As illustrated in FIG. 2, with the provision of the parallel resonance circuit according to this embodiment, an attenuation pole may be obtained at a specific frequency, and gentle attenuation characteristics may be achieved. Accordingly, an attenuation of a specific amount or more may be achieved in a wide band centered at the attenuation pole frequency. Therefore, even in an aspect in which a harmonic frequency (frequency band) of a transmission signal of a Low band is close to or partially overlaps with a fundamental frequency (frequency band) of a reception signal of a Hi band, a harmonic signal may be attenuated.

Figure 3:
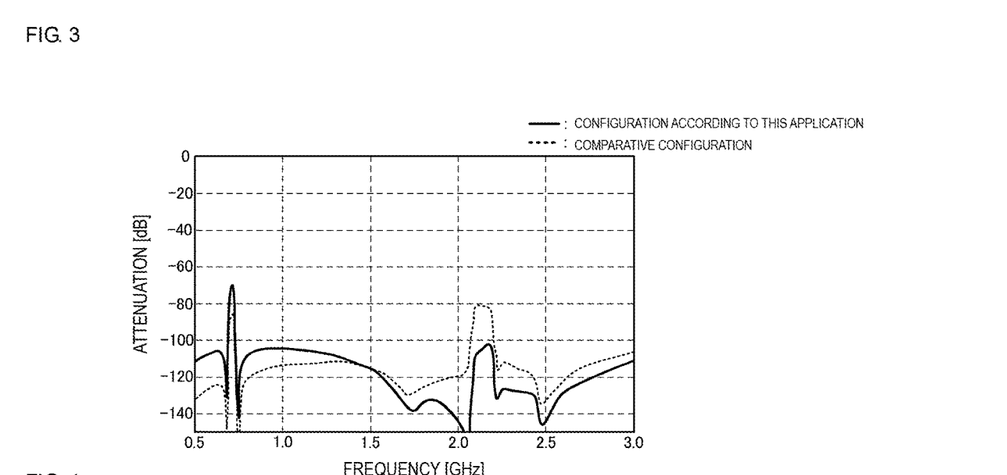
FIG. 3 is a graph illustrating the isolation characteristics of a configuration of the high-frequency switch module according to the first embodiment of the present disclosure and a comparative configuration.

FIG. 3 is a graph illustrating the isolation characteristics of a configuration of the high-frequency switch module according to the first embodiment of the present disclosure and a comparative configuration. The comparative configuration is a configuration not including the inductor 30. As illustrated in FIG. 3, with the comparative configuration, a harmonic component of a transmission signal of a Low band which is input from the second RF terminal leaks and is output to the first RF terminal. However, with the configuration according to this application, the leakage is suppressed.

Accordingly, with the use of the configuration of this embodiment, a situation in which a harmonic component of a transmission signal of a Low band at the time of carrier aggregation leaks to an output terminal of a reception signal of a Hi band may be suppressed. Thus, the reception sensitivity of the reception signal of the Hi band at the time of carrier aggregation may be improved. Furthermore, with the use of the configuration according to this embodiment, even if selection target terminals to be used at the same time for carrier aggregation are close to each other, a high isolation between connection conductors which are connected to the selection target terminals may be ensured. That is, a small-size high-frequency switch module whose transmission and reception characteristics of communication bands to be used for carrier aggregation are not degraded even if carrier aggregation is implemented, may be achieved.

Figure 4:
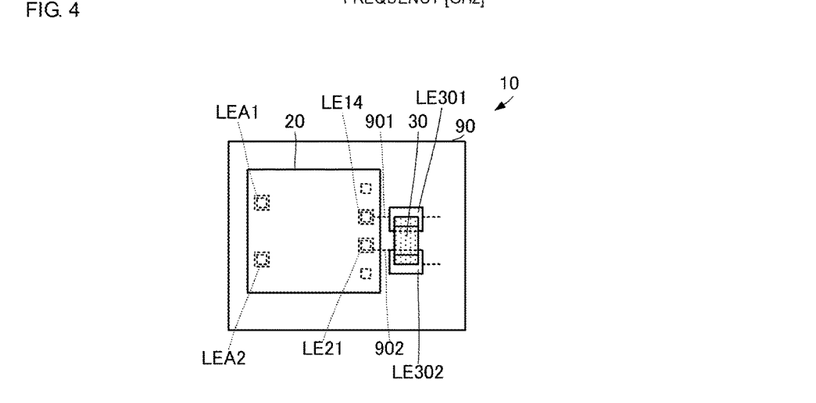
FIG. 4 is a plan view of the high-frequency switch module according to the first embodiment of the present disclosure.

The high-frequency switch module 10 having the above configuration is implemented by the structure described below. FIG. 4 is a plan view of the high-frequency switch module according to the first embodiment of the present disclosure. In FIG. 4, only parts of the high-frequency switch module 10 that are characteristic to the present application are illustrated.

The high-frequency switch module 10 includes a multilayer body 90, the mounted-type switch element 20, and the mounted-type inductor 30. The multilayer body 90 includes multiple layers of dielectric substrates at which a conductive pattern is formed in a specific position. The mounted-type switch element 20 and the mounted-type inductor 30 are mounted on a surface of the multilayer body 90.

A land conductor LE301 at which one external conductor of the inductor 30 is mounted and a land conductor LE14 at which the selection target terminal P14 of the switch element 20 is mounted are connected by the connection conductor 901 formed at the multilayer body 90. A land conductor LE302 at which the other external conductor of the inductor 30 is mounted and a land conductor LE21 at which the selection target terminal P21 of the switch element 20 is mounted are connected by the connection conductor 902 formed at the multilayer body 90.

The inductor 30 is mounted in the vicinity of the selection target terminals P14 and P21 of the switch element 20. The connection conductors 901 and 902 are formed with a distance which is as short as possible therebetween.

With this configuration, the capacitive coupling between the connection conductors 901 and 902 may be suppressed. Thus, the isolation on the side of selection target terminals of the switch element 20 may further be improved.

Figure 5A:
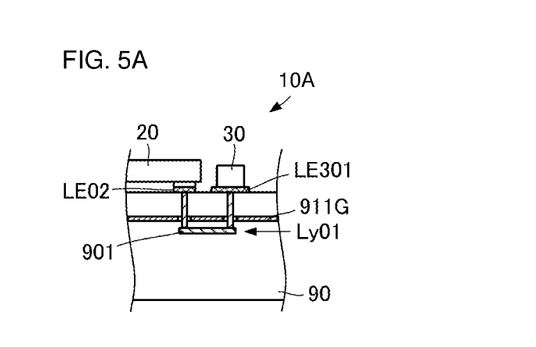
FIGS. 5A and 5B include partial cross-section views illustrating a structure of a high-frequency switch module according to a second embodiment of the present disclosure.
Figure 5B:
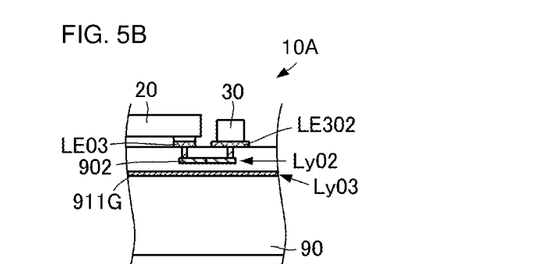

Next, a high-frequency switch module according to a second embodiment of the present disclosure will be described with reference to a drawing. FIGS. 5A and 5B include partial cross-section views illustrating a structure of the high-frequency switch module according to the second embodiment of the present disclosure.

A high-frequency switch module 10A according to this embodiment is different from the high-frequency switch module 10 according to the first embodiment in the structure of the connection conductors 901 and 902.

A part of the connection conductor 901 that extends in a direction orthogonal to the laminating direction of the multilayer body 90 is arranged at a position corresponding to a dielectric layer Ly01 of the multilayer body 90. A part of the connection conductor 902 that extends in a direction orthogonal to the laminating direction of the multilayer body 90 is arranged at a position corresponding to a dielectric layer Ly02 of the multilayer body 90.

With this configuration, the part of the connection conductor 901 that extends in the direction orthogonal to the laminating direction of the multilayer body 90 and the part of the connection conductor 902 that extends in the direction orthogonal to the laminating direction of the multilayer body 90 are arranged at different positions both in plan view and side view. Accordingly, the capacitive coupling between the connection conductor 901 and the connection conductor 902 may further be suppressed. Therefore, the isolation on the side of selection target terminals of the switch element 20 may further be improved.

Furthermore, in the laminating direction of the multilayer body 90, a dielectric layer Ly03 is arranged between the dielectric layer Ly01 at which the connection conductor 901 is arranged and the dielectric layer Ly02 at which the connection conductor 902 is arranged. An inner-layer ground conductor 911G is formed at the dielectric layer Ly03.

With this configuration, the inner-layer ground conductor 911G is arranged between the connection conductor 901 and the connection conductor 902, and therefore, the capacitive coupling between the connection conductor 901 and the connection conductor 902 may be avoided. Thus, the isolation on the side of selection target terminals of the switch element 20 may further be improved.

Figure 6:
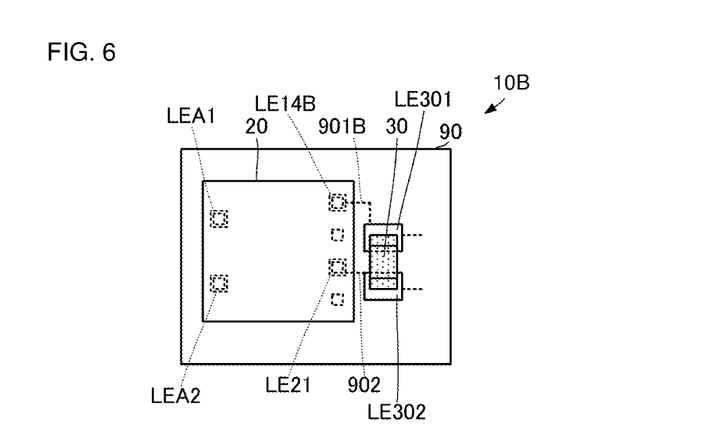
FIG. 6 is a plan view illustrating a structure of a high-frequency switch module according to a third embodiment of the present disclosure.

Next, a high-frequency switch module according to a third embodiment of the present disclosure will be described with reference to a drawing. FIG. 6 is a plan view illustrating a structure of the high-frequency switch module according to the third embodiment of the present disclosure.

In a high-frequency switch module 10B according to this embodiment, a land conductor LE301 at which one external conductor of the inductor 30 is mounted and a land conductor LE14B at which a selection target terminal P14B of the switch element 20 is mounted are connected by a connection conductor 901B formed at the multilayer body 90. A land conductor LE302 at which the other external conductor of the inductor 30 is mounted and the land conductor LE21 at which the selection target terminal P21 of the switch element 20 is mounted are connected by the connection conductor 902 formed at the multilayer body 90.

A selection target terminal with which carrier aggregation is not performed at the same time as the selection target terminal P14B and the selection target terminal P21 is arranged between the selection target terminal P14B and the selection target terminal P21.

With this configuration, selection target terminals connected to the connection conductors 901B and 902 which may have a problem of leakage of a high-frequency signal are isolated from each other, and another selection target terminal is arranged between the selection target terminals. Accordingly, the capacitive coupling between selection target terminals used at the same time for carrier aggregation is suppressed. Furthermore, the connection conductor 901B and the connection conductor 902 connected to these terminals are isolated from each other. Thus, the capacitive coupling between the connection conductor 901B and the connection conductor 902 may be suppressed. Consequently, the isolation on the side of selection target terminals of the switch element 20 may further be improved.

Figure 7:
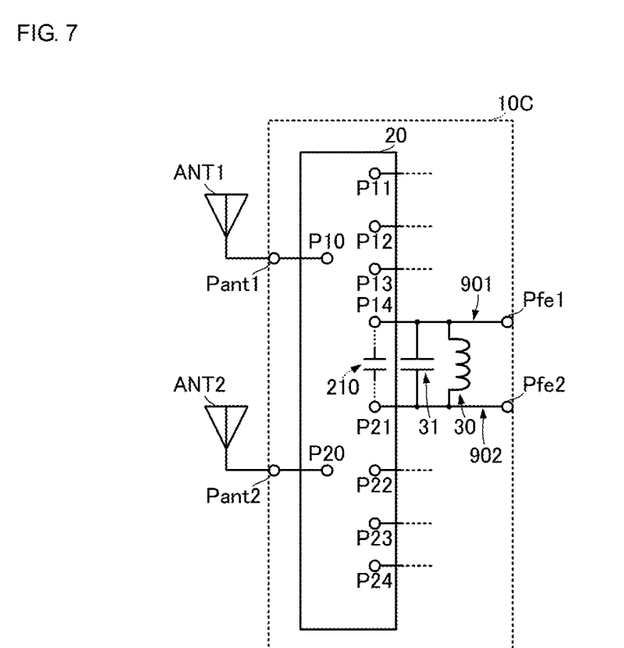
FIG. 7 is a circuit diagram of a high-frequency switch module according to a fourth embodiment of the present disclosure.

Next, a high-frequency switch module according to a fourth embodiment of the present disclosure will be described with reference to a drawing. FIG. 7 is a circuit diagram of the high-frequency switch module according to the fourth embodiment of the present disclosure.

A high-frequency switch module 10C according to this embodiment is configured such that a capacitor 31 is added to the high-frequency switch module 10 according to the first embodiment.

The capacitor 31 is connected in parallel with the inductor 30. With this configuration, capacitance forming a parallel resonance circuit is a combined capacitance of the capacitance of the capacitor 31 and the capacitance based on the capacitive coupling between selection target terminals.

As described above, with the provision of the capacitor 31, a larger capacitance of the parallel resonance circuit may be achieved. Accordingly, a smaller inductance of the inductor 30 may be achieved. With a reduction in the inductance, the size of the inductor 30 may be reduced. Therefore, the size of the high-frequency switch module 10C may further be reduced.

Figure 8:
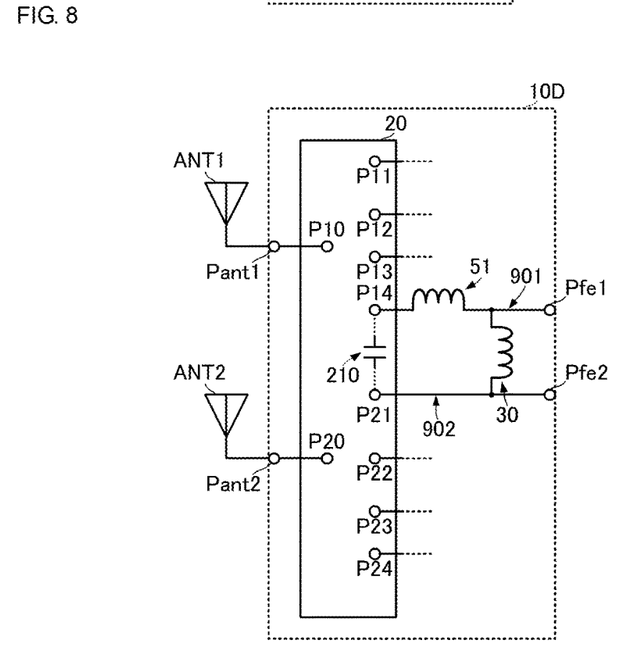
FIG. 8 is a circuit diagram of a high-frequency switch module according to a fifth embodiment of the present disclosure.

Next, a high-frequency switch module according to a fifth embodiment of the present disclosure will be described with reference to a drawing. FIG. 8 is a circuit diagram of the high-frequency switch module according to the fifth embodiment of the present disclosure.

A high-frequency switch module 10D according to this embodiment is configured such that a matching inductor 51 is added to the high-frequency switch module 10 according to the first embodiment.

The matching inductor 51 is connected between the selection target terminal P14 at the connection conductor 901 and one external conductor of the inductor 30.

With this configuration, impedance when the switch element 20 is viewed from the inductor 30 and the first RF terminal Pfe1 may be shifted from capacitive impedance to inductive impedance. For example, in the case where the frequency of a high-frequency signal transmitted through the first RF terminal Pfe1 is higher than the frequency of a high-frequency signal transmitted through the second RF terminal Pfe2, the capacitive impedance when the selection target terminal P14 is viewed is higher than the capacitive impedance when the selection target terminal P21 is viewed.

In the high-frequency switch module 10D according to this embodiment, with the provision of the matching inductor 51, the impedance when the selection target terminal P14 is viewed and the impedance when the selection target terminal P21 is viewed at the frequency of a high-frequency signal to be transmitted may be set to substantially the same. Accordingly, high-frequency signals to be transmitted through the first and second RF terminals Pfe1 and Pfe2 may be transmitted with a low loss while the isolation on the side of selection target terminals of the switch element 20 being ensured.

Figure 9:
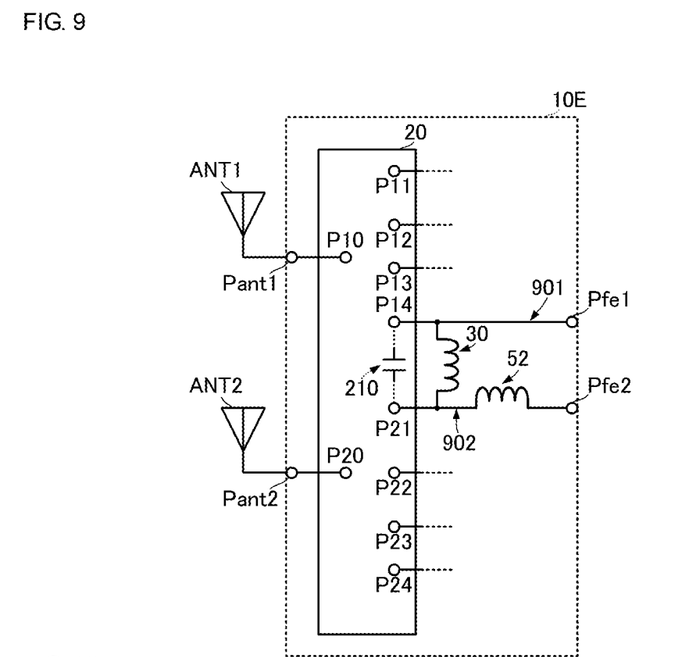
FIG. 9 is a circuit diagram of a high-frequency switch module according to a sixth embodiment of the present disclosure.

Next, a high-frequency switch module according to a sixth embodiment of the present disclosure will be described with reference to a drawing. FIG. 9 is a circuit diagram of the high-frequency switch module according to the sixth embodiment of the present disclosure.

A high-frequency switch module 10E according to this embodiment is configured such that a matching inductor 52 is added to the high-frequency switch module 10 according to the first embodiment.

The matching inductor 52 is connected between the other external conductor of the inductor 30 at the connection conductor 902 and the second RF terminal Pfe2.

With this configuration, impedance when the second RF terminal Pfe2 is viewed from the inductor 30 and the switch element 20 (as a more specific example, impedance when an elastic wave filter connected to the second RF terminal Pfe2 is viewed from the inductor 30 and the switch element 20) may be shifted from capacitive impedance to inductive impedance. For example, in the case where the frequency of a high-frequency signal transmitted through a SAW filter 42 connected to the second RF terminal Pfe2 is lower than the frequency of a high-frequency signal transmitted through a SAW filter 41 connected to the first RF terminal Pfe1, capacitive impedance when the second RF terminal Pfe2 is viewed is higher than capacitive impedance when the first RF terminal Pfe1 is viewed.

In the high-frequency switch module 10E according to this embodiment, with the provision of the matching inductor 52, the impedance when the first RF terminal Pfe1 is viewed and the impedance when the second RF terminal Pfe2 is viewed at the frequency of a high-frequency signal to be transmitted may be set to substantially the same. Accordingly, high-frequency signals to be transmitted through the first and second RF terminals Pfe1 and Pfe2 may be transmitted with low loss while the isolation on the side of selection target terminals of the switch element 20 being ensured.

Figure 10:
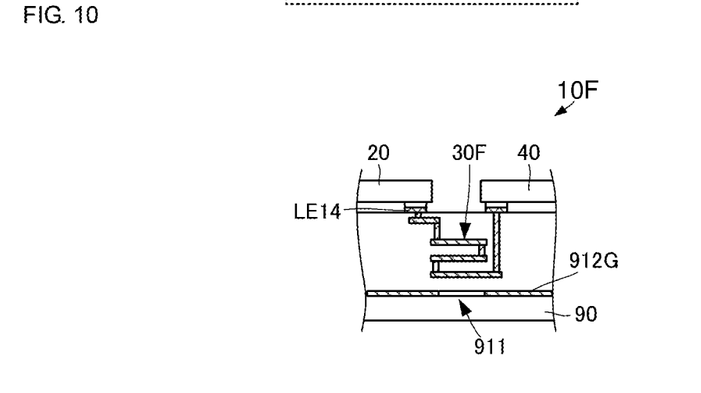
FIG. 10 is a partial cross-section view illustrating a structure of a high-frequency switch module according to a seventh embodiment of the present disclosure.

Next, a high-frequency switch module according to a seventh embodiment of the present disclosure will be described with reference to a drawing. FIG. 10 is a partial cross-section view illustrating a structure of the high-frequency switch module according to the seventh embodiment of the present disclosure.

A high-frequency switch module 10F according to this embodiment is different from the high-frequency switch module 10 according to the first embodiment in that an inductor 30F is formed inside the multilayer body 90.

The inductor 30F is formed in a spiral shape by conductive patterns formed in the multilayer body 90. Here, the winding axis of the inductor 30F is parallel to the laminating direction.

An inner ground conductor (a ground conductor which is close to an inductor of the present disclosure) 912G of the multilayer body 90 is formed over substantially the entire surface when the multilayer body 90 is viewed in a plan view, but has a cavity 911.

The cavity 911 overlaps with a cavity at the center of the spiral shape of the inductor 30F when the multilayer body 90 is seen in a plan view.

With this configuration, the size of the shape of the high-frequency switch module 10F when viewed in a plan view is smaller than the size of the shape of the high-frequency switch module 10 when viewed in a plan view. Furthermore, a magnetic field generated by the inductor 30F is not blocked by an inner ground conductor 912G. Thus, the degradation in Q of the inductor 30F may be suppressed. Consequently, the isolation on the side of selection target terminals of the switch element 20 may further be improved.

In the case where an aspect in which an inductor mounted inside the multilayer body 90 is not coupled to another circuit element or circuit pattern is required, a pair of inner-layer ground conductors may be arranged to sandwich the inductor 30F therebetween in the laminating direction. Accordingly, the inductor 30F may be prevented from being coupled to the other circuit element or circuit pattern.

Furthermore, in each of the foregoing embodiments, an aspect in which leakage of a harmonic component is suppressed by a resonance circuit is described. However, a configuration in which leakage of a fundamental frequency component is also suppressed by a resonance circuit may also be provided. In this case, a circuit in which a plurality of LC parallel resonance circuits are connected in series with each other, or the like may be used as the resonance circuit.

10, 10A, 10B, 10C, 10D, 10E, 10F: high-frequency switch module
20: switch element
30, 30D, 30F: inductor
31: capacitor
51, 52: matching inductor
53: characteristics matching inductor
90: multilayer body
901, 902, 901B: connection conductor
911G, 912G: inner ground conductor
911: cavity

The invention claimed is:

1. A high-frequency switch module comprising:
    a switch element including a first common terminal connected to a Hi band antenna, a second common terminal connected to a Low band antenna, a plurality of first selection target terminals selectively connected to the first common terminal, and a plurality of second selection target terminals selectively connected to the second common terminal; and
    an inductor directly connected between one of the plurality of first selection target terminals and one of the plurality of second selection target terminals.

2. The high-frequency switch module according to claim 1,
    wherein the first selection target terminal and the second selection target terminal connected to the inductor are simultaneously used terminals used for electric paths through which simultaneous transmission or simultaneous reception using a plurality of communication bands is performed.

3. The high-frequency switch module according to claim 2, further comprising:
a circuit substrate at which the switch element and the inductor are mounted,
wherein a first connection conductor connecting the first selection target terminal as the simultaneously used terminal to the inductor and a second connection conductor connecting the second selection target terminal as the simultaneously used terminal to the inductor are formed at the circuit substrate,
wherein the first connection conductor and the second connection conductor are arranged at positions different in a thickness direction of the circuit substrate, and
wherein the circuit substrate includes
an inner-layer ground conductor between the first connection conductor and the second connection conductor.

4. The high-frequency switch module according to claim 3,
wherein the switch element includes
a third selection target terminal between the first selection target terminal as the simultaneously used terminal and the second selection target terminal as the simultaneously used terminal, the third selection target terminal using a communication band different from the plurality of communication bands used by the simultaneously used terminals.

5. The high-frequency switch module according to claim 3, further comprising:
a capacitor connected in parallel with the inductor.

6. The high-frequency switch module according to claim 3, further comprising:
a first RF terminal connected to the first selection target terminal as the simultaneously used terminal, and a first connection conductor connecting the first RF terminal to the first selection target terminal as the simultaneously used terminal,
wherein a matching inductor is connected between the first selection target terminal as the simultaneously used terminal and the inductor at the first connection conductor.

7. The high-frequency switch module according to claim 3, further comprising:
a second RF terminal connected to the second selection target terminal as the simultaneously used terminal, and a second connection conductor connecting the second RF terminal to the second selection target terminal as the simultaneously used terminal,
wherein a matching inductor is connected between the inductor and the second RF terminal at the second connection conductor.

8. The high-frequency switch module according to claim 3,
wherein the inductor is a conductive pattern in a spiral shape provided at a circuit substrate, and
wherein a ground conductor provided inside the circuit substrate and close to the inductor has a shape not overlapping with a cavity at the center of the spiral shape.

9. The high-frequency switch module according to claim 2,
wherein the switch element includes
a third selection target terminal between the first selection target terminal as the simultaneously used terminal and the second selection target terminal as the simultaneously used terminal, the third selection target terminal using a communication band different from the plurality of communication bands used by the simultaneously used terminals.

10. The high-frequency switch module according to claim 9, further comprising:
a capacitor connected in parallel with the inductor.

11. The high-frequency switch module according to claim 9, further comprising:
a first RF terminal connected to the first selection target terminal as the simultaneously used terminal, and a first connection conductor connecting the first RF terminal to the first selection target terminal as the simultaneously used terminal,
wherein a matching inductor is connected between the first selection target terminal as the simultaneously used terminal and the inductor at the first connection conductor.

12. The high-frequency switch module according to claim 9, further comprising:
a second RF terminal connected to the second selection target terminal as the simultaneously used terminal, and a second connection conductor connecting the second RF terminal to the second selection target terminal as the simultaneously used terminal,
wherein a matching inductor is connected between the inductor and the second RF terminal at the second connection conductor.

13. The high-frequency switch module according to claim 9,
wherein the inductor is a conductive pattern in a spiral shape provided at a circuit substrate, and
wherein a ground conductor provided inside the circuit substrate and close to the inductor has a shape not overlapping with a cavity at the center of the spiral shape.

14. The high-frequency switch module according to claim 2, further comprising:
a capacitor connected in parallel with the inductor.

15. The high-frequency switch module according to claim 14, further comprising:
a first RF terminal connected to the first selection target terminal as the simultaneously used terminal, and a first connection conductor connecting the first RF terminal to the first selection target terminal as the simultaneously used terminal,
wherein a matching inductor is connected between the first selection target terminal as the simultaneously used terminal and the inductor at the first connection conductor.

16. The high-frequency switch module according to claim 14, further comprising:
a second RF terminal connected to the second selection target terminal as the simultaneously used terminal, and a second connection conductor connecting the second RF terminal to the second selection target terminal as the simultaneously used terminal,
wherein a matching inductor is connected between the inductor and the second RF terminal at the second connection conductor.

17. The high-frequency switch module according to claim 14,
wherein the inductor is a conductive pattern in a spiral shape provided at a circuit substrate, and
wherein a ground conductor provided inside the circuit substrate and close to the inductor has a shape not overlapping with a cavity at the center of the spiral shape.

18. The high-frequency switch module according to claim 2, further comprising:
a first RF terminal connected to the first selection target terminal as the simultaneously used terminal, and a first connection conductor connecting the first RF terminal to the first selection target terminal as the simultaneously used terminal,
wherein a matching inductor is connected between the first selection target terminal as the simultaneously used terminal and the inductor at the first connection conductor.

19. The high-frequency switch module according to claim 2, further comprising:
a second RF terminal connected to the second selection target terminal as the simultaneously used terminal, and a second connection conductor connecting the second RF terminal to the second selection target terminal as the simultaneously used terminal,
wherein a matching inductor is connected between the inductor and the second RF terminal at the second connection conductor.

20. The high-frequency switch module according to claim 2,
wherein the inductor is a conductive pattern in a spiral shape provided at a circuit substrate, and
wherein a ground conductor provided inside the circuit substrate and close to the inductor has a shape not overlapping with a cavity at the center of the spiral shape.

* * * * *